United States Patent
Concord (10) Patent No.: US 8,525,617 B2
(45) Date of Patent: Sep. 3, 2013

(54) COMMON-MODE FILTER WITH COUPLED INDUCTANCES

(75) Inventor: Joël Concord, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 552 days.

(21) Appl. No.: 12/770,041

(22) Filed: Apr. 29, 2010

(65) Prior Publication Data
US 2010/0277256 A1  Nov. 4, 2010

(30) Foreign Application Priority Data
Apr. 30, 2009 (FR) ...................................... 09 52872

(51) Int. Cl.
*H03H 7/00*  (2006.01)

(52) U.S. Cl.
USPC .......................................... 333/177; 333/181

(58) Field of Classification Search
USPC .................. 333/4, 5, 167, 168, 174, 202–205, 333/177, 181, 185
See application file for complete search history.

(56) References Cited

U.S. PATENT DOCUMENTS

| | | | |
|---|---|---|---|
| 5,142,430 A | 8/1992 | Anthony | |
| 6,218,913 B1 * | 4/2001 | Pagenkopf | 333/181 |
| 6,529,750 B1 | 3/2003 | Zhang et al. | |
| 7,612,629 B2 * | 11/2009 | Pepper | 333/20 |
| 2006/0049890 A1 | 3/2006 | Wasaki et al. | |
| 2007/0188265 A1 | 8/2007 | Perreault et al. | |
| 2007/0252664 A1 * | 11/2007 | Saitoh et al. | 333/175 |
| 2009/0309686 A1 | 12/2009 | Espino | |
| 2010/0277254 A1 | 11/2010 | Guitton et al. | |

FOREIGN PATENT DOCUMENTS

JP  02270414 A  11/1990

OTHER PUBLICATIONS

French Search Report dated Feb. 1, 2010 from corresponding French Application No. 09/52872.
Search Report dated Feb. 8, 2010 from related French Application No. 09/52870.

* cited by examiner

*Primary Examiner* — Benny Lee
*Assistant Examiner* — Gerald Stevens
(74) *Attorney, Agent, or Firm* — Wolf, Greenfield & Sacks, P.C.

(57) ABSTRACT

A common-mode filter including, in series between a first input terminal and a first output terminal, a first and a second positively coupled inductive elements; in series between a second input terminal and a second output terminal, a third and a fourth positively coupled inductive elements; and in series between each midpoint of said series connections of inductive elements and the ground, a capacitive element and a fifth inductive element.

17 Claims, 5 Drawing Sheets

COMMON-MODE FILTER WITH COUPLED INDUCTANCES

CROSS REFERENCE TO RELATED APPLICATIONS

This application claims the priority benefit of French patent application number 09/52872, filed on Apr. 30, 2009, entitled "COMMON-MODE FILTER WITH COUPLED INDUCTANCES," which is hereby incorporated by reference to the maximum extent allowable by law.

BACKGROUND OF THE INVENTION

1. Field of the Invention

The present invention generally relates to electronic circuits, and more specifically to common-mode filters used in such circuits.

2. Discussion of the Related Art

Figure 1:
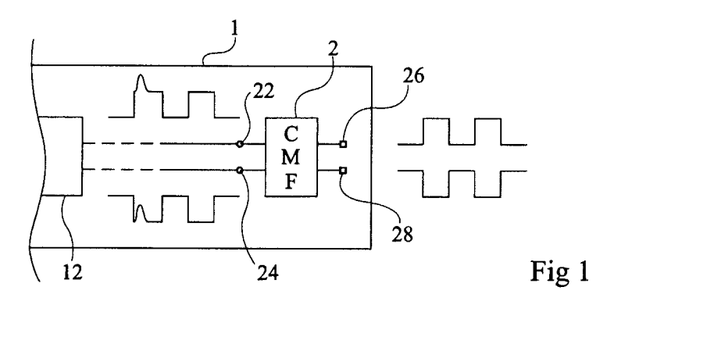
FIG. 1, previously described, shows an example of an electronic circuit of the type to which the present invention applies as an example.

FIG. 1 is a block diagram of an electronic board 1 comprising, in addition to one or several circuits 12 capable of providing differential signals, at least one common-mode filter 2 (CMF) of the type to which the present invention applies. Such a filter comprises two input terminals 22 and 24 and two output terminals 26 and 28. The input terminals are intended to receive the differential signals to be processed, the filtered result of which is output.

As illustrated by the examples of signal curves in FIG. 1, the function of a common-mode filter is to let through the differential signals which are in phase opposition and to attenuate or cut the common-mode signals and noise which are in phase on the two inputs. An ideal common-mode filter is a short-circuit for signals in phase opposition at the input and an open circuit for signals in phase. In practice, the filter always lets through low frequencies, and thus a bias level common to the two differential signals.

Common-mode filters are generally used for differential data accesses in digital processing circuits, especially if the frequency of the useful signals is in the same range as the frequency of the common-mode noise or signals which are desired to be rejected.

Common-mode filters can also be found in analog circuits, for example, to process signals in differential microphones, where the signal is transmitted symmetrically.

Figure 2:
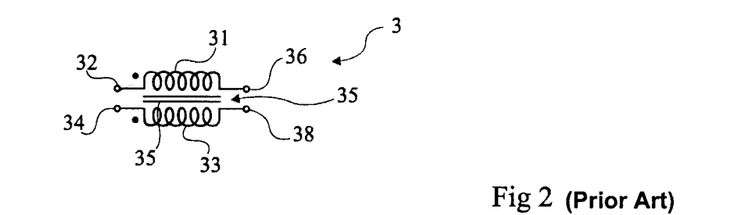
FIG. 2, previously described, shows a usual example of a common-mode filter.

FIG. 2 shows an example of a usual common-mode filter 3. Such a filter is formed of two inductances 31 and 33 respectively connecting input and output accesses 32 and 36 and input and output accesses 34 and 38. Inductances 31 and 33 are coupled by a magnetic material 35. The respective phase points of inductances 31 and 33 are on the same side (in the example, on the side of input terminals 32 and 34) to avoid filtering signals in phase opposition. The operating principle of filter 3 of FIG. 2 is to exhibit a high series impedance for signals in phase and a low series impedance for signals in phase opposition.

The use of a magnetic material 35 is linked to the need to have high inductances having a high series impedance in common mode, without the size of the filter becoming too large.

This solution is thus limited to applications in which such a magnetic material can be used. In particular, this may not be possible when common-mode filters are desired to be integrated, for example on semiconductor or isolating substrates (for example, glass). Integrating inductive elements with the deposition of a ferromagnetic layer is not only difficult, but also very expensive.

A common-mode filter without magnetic material is thus needed.

Further, in integrated technology, circuits are often needed to be protected against possible electrostatic discharges. A common-mode filter with an ESD protection is thus desireable.

SUMMARY OF THE INVENTION

At least one embodiment of the present invention aims at overcoming all or part of the disadvantages of usual common-mode filters.

An embodiment of the present invention more specifically aims at avoiding the use of a magnetic material in a common-mode filter.

Another object of an embodiment of the present invention is providing an integrated structure compatible with an ESD protection.

Another object of an embodiment of the present invention is to provide an easily-integrable solution.

To achieve all or part of these and other objects, the present invention provides a common-mode filter comprising:

in series between a first input terminal and a first output terminal, a first and a second positively coupled inductive elements;

in series between a second input terminal and a second output terminal, a third and a fourth positively coupled inductive elements; and in series between each midpoint of said series connections of inductive elements and the ground, a capacitive element and a fifth inductive element.

According to an embodiment of the present invention, the fifth inductive element is common to the two capacitive elements.

According to an embodiment of the present invention, an additional capacitive element is connected in parallel on the fifth inductive element.

According to an embodiment of the present invention, the respective phase points of the first, second, third, and fourth inductive elements are all directed either towards the input terminals, or towards the output terminals.

According to an embodiment of the present invention, said capacitive elements are formed by diodes.

According to an embodiment of the present invention, the anodes of said diodes are common.

According to an embodiment of the present invention, an additional diode is connected in series with the fifth inductive element between the common anodes of said diodes and ground.

According to an embodiment of the present invention, two diodes are connected in anti-series between each mid-point and said fifth inductive element.

According to an embodiment of the present invention, the filter is made in integrated form.

The foregoing objects, features, and advantages of the present invention will be discussed in detail in the following non-limiting description of specific embodiments in connection with the accompanying drawings.

DETAILED DESCRIPTION

The same elements have been designated with the same reference numerals in the different drawings. For clarity, only those elements which are useful to the understanding of the present invention have been shown and will be described. In particular, the circuits connected upstream or downstream of a common-mode filter have not been detailed, the present invention being compatible with usual applications of such common-mode filters.

A field to which the present invention more specifically applies is the use of common-mode filters in radiofrequency transmission systems. In particular, common-mode filters are widely used in mobile communication equipment of cell phone type for several reasons.

One reason is that the differential lines conveying data are high-rate lines and are thus radiating signals in the different receive bands of the communication device. A common-mode filter is then used to filter the receive bands of the phone by being generally placed at the output of the differential transmitter generating high-rate signals.

Another reason is that the phone antenna generally has a power (for example, on the order of 2 watts for GSM phones) sufficient for its radiation to be captured by the lines conveying the high-rate signals in the electronic circuits. To avoid this, a common-mode filter is placed at the input of the differential receiver and filters the transmission frequency bands of the phone.

Another advantage of a common-mode filter is to avoid radiations in the case of a phase-shift (intrinsic or incidental) of the differential signals.

Such phase-shifts may result from slight pattern differences of the conductive lines on integrated or printed circuits. Without any filter, the sensitivity and the reception of the phone are altered.

To integrate or decrease the cost of a common-mode filter, it might be devised to eliminate the magnetic material of the example of FIG. 2, and to make the inductances in the form of planar windings in two superposed conductive levels (separated by an insulator) with as low a series resistance of the inductances as possible (preferably at most a few ohms, or even below one ohm) to avoid adversely affecting the transmission of the differential signals. However, the inductance values which should be provided to properly attenuate the common mode as well as the need for a low series resistance would generate a bulk incompatible with the desired miniaturization of electronic circuits and devices, non-competitive with common-mode filters with a magnetic material. For example, to form a filter exhibiting a common-mode attenuation greater than 15 dB at 900 MHz (GSM band), several mm$^2$ would be necessary to integrate 50-nH inductances having a 242-Ω series inductance.

Further, the structure surface would generate significant stray capacitances which would lower the differential filtering and common-mode performances, and would thus result in a modification of the filter impedance in differential mode, which is critical for connections conveying digital signals which are generally impedance-matched.

Figure 3:
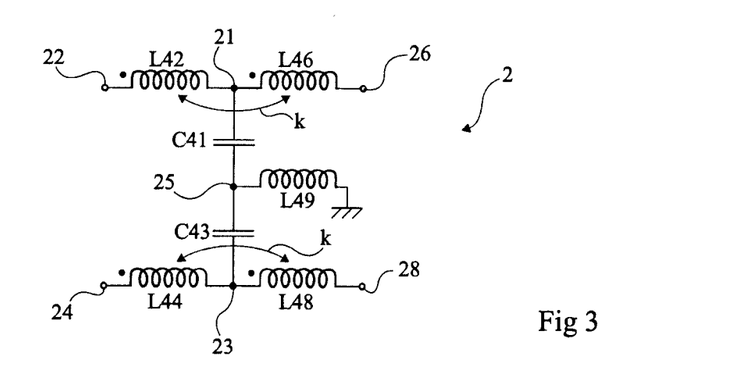
FIG. 3 shows an embodiment of a common-mode filter.

FIG. 3 shows an embodiment of a common-mode filter 2.

According to this embodiment, input terminals 22 and 24 are directly connected to respective output terminals 26 and 28 via series associations of inductive elements L42 and L46, respectively L44 and L48. Midpoints 21 and 23 of the series connections of these inductive elements are connected by two capacitive elements C41 and C43 in series, and the midpoint 25 of this series connection is grounded by an inductive element L49. Inductive elements L42 and L46 are positively coupled (coupling coefficient k>0) and elements L44 and L48 are also positively coupled. The coupling between inductive elements L42 and L43, respectively L44 and L48, is illustrated by arrows referred to as k. The phase points of windings L42, L44, L46, and L48 are all on the same side (for example, on the input terminal side).

It should be noted that the filter is bidirectional, that is, the designation of the inputs and of the outputs is linked to the filter assembly in its application.

The operation is the following. When signals in phase opposition are presented on terminals 22 and 24, the voltage of midpoint 25 is zero and no current flows through grounded inductance L49. The differential mode signals thus directly transit from terminals 22 to 26 or 24 to 28 and are only submitted to the attenuation linked to the series impedance of inductive elements L42 and L46, respectively L44 and L48.

In the presence, on terminals 22 and 24, of signals in phase or of a common-mode component originating from noise occurring on the differential signals, and due to capacitive elements 41 and 43, this common-mode component is transmitted to node 25, then carried off to ground through inductance L49. Thus, functionally, instead of exhibiting a high series impedance between the input/output terminals, filter 2 carries off the common-mode components or noise to ground, while letting through the differential signals, with no ground losses.

The provided structure enables to use inductances L42, L46, and L44, L48 which have sufficiently low values for the series resistance in differential mode to be acceptable, and which have a surface area compatible with an integrated technology, especially due to the coupling between inductances, which enables to increase by a factor 3 to 4 the inductance value with respect to a non-coupled inductance of same surface area.

Due to the coupling between inductances, a portion of the signal goes, in differential mode, directly to the output. This further decreases the attenuation of the differential mode signal and allows a wider bandwidth.

The respective values of capacitive elements C41 and C43 are preferably equal, to avoid any dissymmetry of the assembly and the introduction of a distortion on the differential signals. Further, to respect to symmetry of the differential signals, inductances L42 and L44 are of same values and inductances L46 and L48 are of same values. Preferably, the four inductances are of same values.

The filter of FIG. 3 behaves, for the common mode signals, as a low-pass filter, having its cut-off frequency set by the values of the different inductive and capacitive elements of the circuit. This cut-off frequency will be selected to correspond to the lowest frequency band of the common-mode signals to be filtered present in the device comprising the common-mode filter.

Figure 4A:
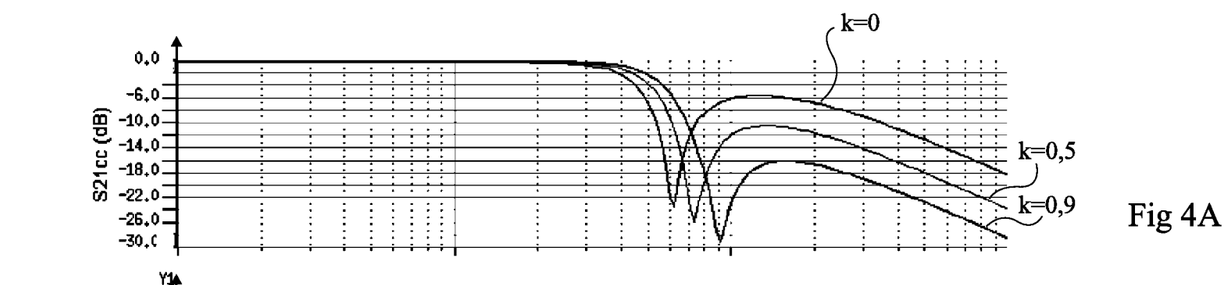
FIGS. 4A, 4B, and 4C illustrate the frequency response of the filter of FIG. 3.
Figure 4B:
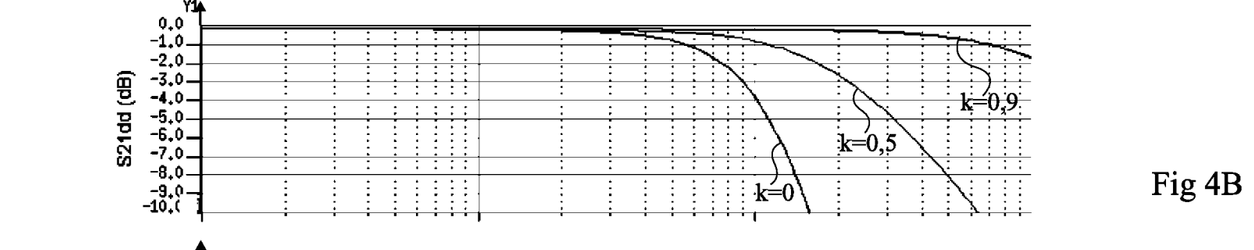
Figure 4C:
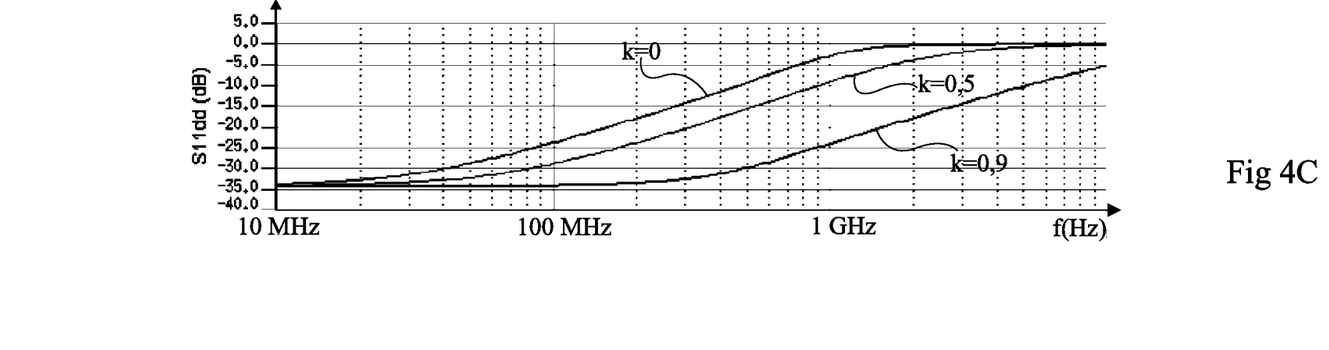

FIGS. 4A, 4B, and 4C illustrate three examples of the frequency response of the filter of FIG. 3 for three different coupling coefficients. The representations of FIGS. 4A, 4B, and 4C are, in frequency, in logarithmic scale. FIG. 4A shows the common mode attenuation (parameter S21cc). FIG. 4B shows the differential mode attenuation (S21dd). FIG. 4C illustrates the reflection losses (S11dd), which are desired to be as low as possible in the operating band of the filter.

The representations of FIGS. 4A to 4C illustrate in full lines an example of a response with a 0.9 coupling, in dotted lines the response of the same filter with a 0.5 coupling, and in stripe-dot lines the response of this filter with a zero coupling (k=0).

The attenuation obtained around one GHz is on the order of −30 dB (FIG. 4B) with a 0.9 coupling coefficient. It can be seen that the increase of the coupling coefficient slightly offsets the cut-off frequency towards high frequencies, but above all improves the differential mode frequency by decreasing the corresponding attenuation (FIG. 4A) and increases the attenuation of reflection losses (FIG. 4C). It should also be noted in FIG. 4B that a decrease of the attenuation which follows the cut-off frequency rapidly disappears as the frequency increases. The decrease slope is then −6 dB per octave.

As a specific embodiment, a filter such as illustrated in FIG. 3 with a response illustrated by FIGS. 4A, 4B, and 4C has been formed with capacitive elements C41 and C43 of approximately 8 picofarads, inductive elements L42, L44, L46, and L48 of approximately 5 nanohenries (exhibiting a series resistance of approximately 1 ohm), a coupling coefficient of approximately 0.9 between elements L42 and L46 and between elements L44 and L48, and an inductive element L49 of approximately 4 nanohenries (exhibiting a series resistance of approximately 1 ohm).

The fact of only filtering, if need be, a narrow line in common mode is not very disturbing since the noise capable with interfering with the differential mode signals is in the cell phone operation frequency band, assumed, in this specific embodiment, to be the GSM band.

More generally, advantage is taken from the fact that the operating frequency band of the electronic device is generally identified. Now, common-mode noise is desired to be avoided in this band. The possible noise outside of the operating band of the electronic device can then be neglected since it will not interfere with the useful signals.

Figure 5:
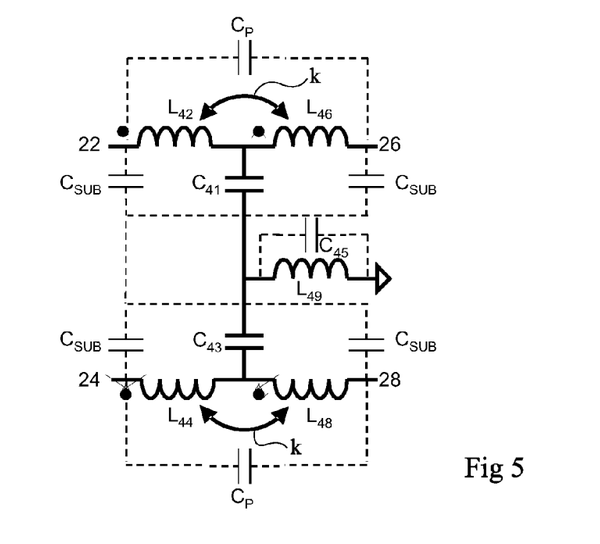
FIG. 5 shows a variation of the embodiment of FIG. 3.

FIG. 5 shows the diagram of FIG. 3 and shows the stray capacitances intervening in an embodiment integrated on a substrate. The equivalent electric connections of these stray capacitances are illustrated in dotted lines. In practice, any inductance comprises stray capacitances, be they inter-spiral capacitances (Cp) or substrate oxide capacitances (Csub), thus creating a capacitive path between the two nodes of the inductance. This capacitive path tends to let through common-mode signals and thus to alter the common-mode attenuation.

To overcome this problem, an additional capacitive element C45 shown in dotted lines may be placed in parallel with inductance L49. Such a capacitive element enables to add a rejection in the frequency band of the filter and to compensate for the degradation linked to the stray capacitances of the inductances.

Figure 6:
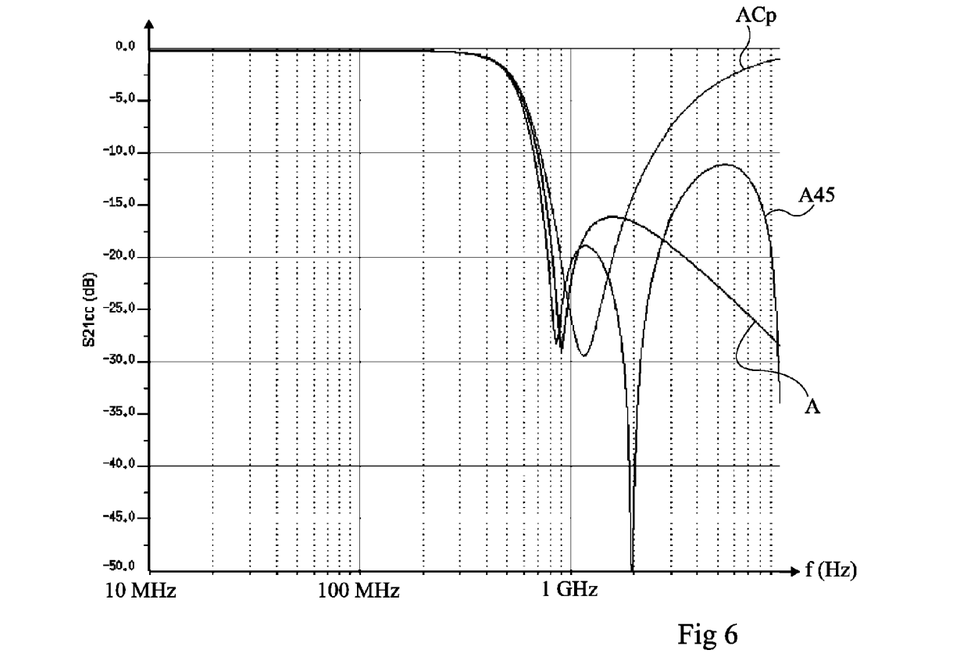
FIG. 6 illustrates examples of responses of the filter of FIG. 5.

FIG. 6 shows three examples of responses of a common mode filter, which is respectively ideal A (with no stray capacitance), with stray capacitances Cp of 300 femtofarads across the inductances and connected between each input/output and capacitances Csub of approximately 0.4 picofarad (curve ACp), and with an element C45 of approximately 1 picofarad (curve A45). Curve A45 shows the improvement brought by capacitance C45 on the common-mode attenuation, by compensating for the degradation due to stray capacitances Cp and Csub.

The coupling between inductances L42 and L46, and between inductances L44 and L48, further enables to use values of several picofarads for capacitances C41 and C43 without significantly altering the cut-off frequency in differential mode (which would be the case if the capacitances were connected to the inputs or the outputs), thus enabling the integration of the capacitances in the form of diodes of protection against electrostatic discharges.

Figure 7:
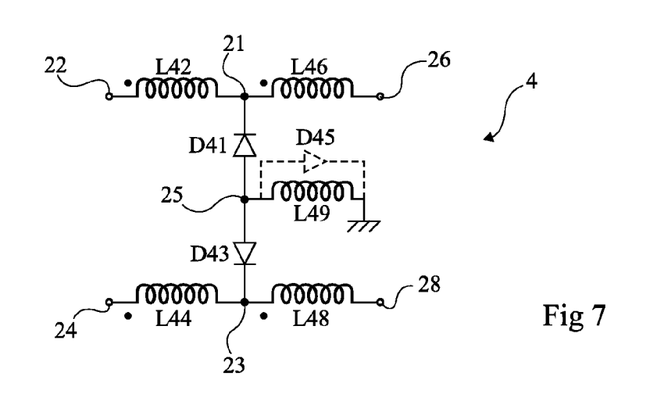
FIG. 7 shows another embodiment of a common-mode filter, protected against possible electrostatic discharges.

FIG. 7 shows an embodiment of a common-mode filter based on the structure of the filter of FIG. 3 and associated with elements of protection against electrostatic discharges (ESD). The obtaining of the ESD protection results from the replacing of capacitive elements C41, C43 with diodes D41, D43 having their respective anodes on the side of node 25. Capacitive element C45 of FIG. 5 may be replaced with a diode D45 which would have its anode connected to the anodes of diodes D41 and D43.

Figure 8:
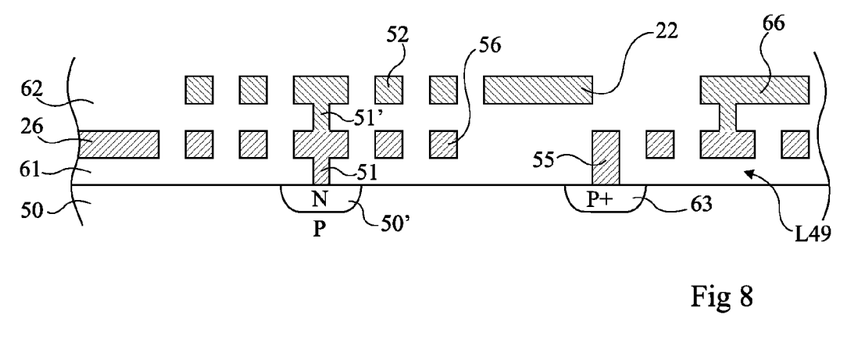
FIG. 8 is a simplified partial cross-section view illustrating an integrated embodiment of the described common-mode filter.

FIG. 8 is a partial cross-section view illustrating an integrated embodiment of the previously-described filter.

Figure 9:
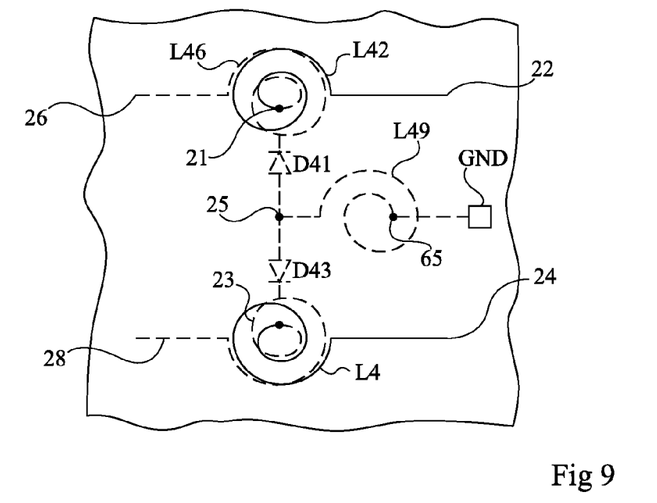
FIG. 9 is a top view of the embodiment of FIG. 8.

FIG. 9 is a top view of the filter of FIG. 8.

In this embodiment, diodes D41, D43, and D45 are assumed to be integrated in a semiconductor substrate 50, for example, of type P. The forming of a PN diode (N doped region 50') in such a substrate raises no difficulty. A first inductive winding (for example, L46) is formed in a conductive level 56 and its internal end (node 21) is connected by a conductive via 51 to the cathode (region 50') of diode D41. First conductive level 56 is separated from substrate 50 by an insulating level 61. A second conductive level 52 is placed on the structure with an interposed second insulating level 62. Winding L42 is formed in this level 52 and its internal end is connected, by a via 51', to the center of winding L46 and to via 51. As illustrated in FIG. 7, to respect the respective positions of the phase points, the windings wind in the same direction from terminal 22 to terminal 26. The same stacked structure is repeated for inductive elements L44 and L48. The winding forming inductance L49 is formed, for example, in first conductive level 56. The center of winding L49 is connected by a via 65 to a track 66 of connection to ground GND. The external end of winding 25 is connected to the respective anodes of diodes D41 and D43, for example, by a P+-doped region 63 or by direct contact with the P substrate.

Figure 10:
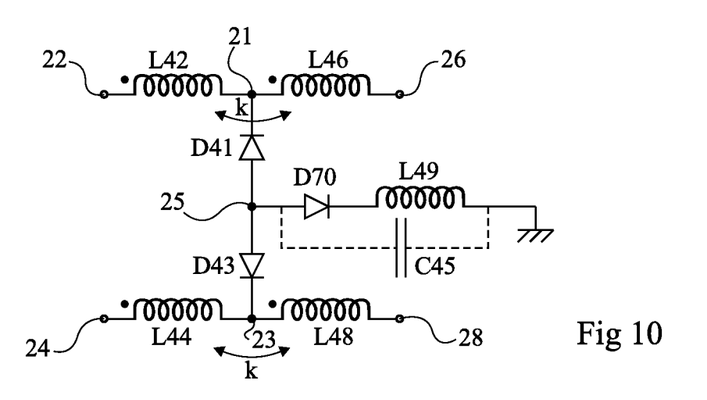
FIG. 10 shows another embodiment of a common-mode filter protected against possible electrostatic discharges.

FIG. 10 shows an embodiment of a common-mode filter adapted to provide a bidirectional protection against electrostatic discharges.

With respect to the above circuits, a diode D70 is connected in series with the inductance L49 between the node 25 and ground. The diode D70 can be connected to node 25 or grounded. An advantage of a connection to node 25 is that it facilitates the integration of the circuit. With respect to the embodiment of FIG. 8, an N+ doped region is provided in contact with the substrate (instead of the region 63). As for the above embodiments, an optional capacitive element C45 (shown by a dotted line) or a diode D45 can be connected between node 25 and ground.

Functionally, the difference is that both polarities of electrostatic discharges are carried off to ground.

Preferably, the area of the diode D70 is greater than the area of diodes D41 and D43, i.e. the equivalent capacity of diode D70 is greater than equivalent capacity of diodes D41 and D43.

Figure 11:
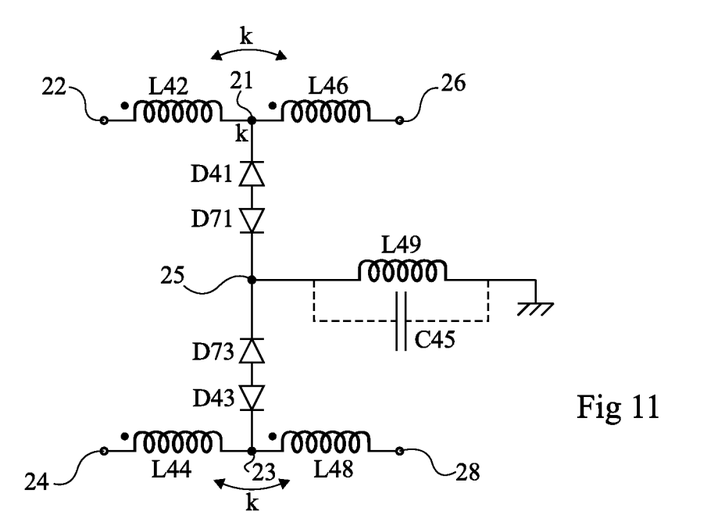
FIG. 11 shows another embodiment of a common-mode filter protected against possible electrostatic discharges.

FIG. 11 shows another embodiment of a common-mode filter adapted to a bidirectional protection against electrostatic discharges.

With respect to the embodiment of FIG. 10, the diode D70 is replaced by two diodes D71 and D73 coupled respectively between the diodes D41 and D43 and the node 25. The diode D71 is connected in anti-series with the diode D41, i.e. their anodes are connected. Alternatively, the positions of the diodes D41 and D71 are inverted and they are connected by their cathodes. The diode D73 is connected in anti-series with the diode D43.

The described structures enable forming a common-mode filter without using magnetic materials, while remaining within reasonable inductance values from an integration point of view. Further, the values of the capacitive elements make the structure compatible with the forming of PN diodes to carry out functions of protection against electrostatic discharges.

Different embodiments with various alternatives have been described. Various alterations and modifications will occur to those skilled in the art. It should be noted that those skilled in the art may combine various elements of these various embodiments and alternatives. In particular, the values to be given to the different components depend on the application and on the attenuation bands desired for the common mode.

Further, it may be attempted to reduce stray capacitances, for example, by superposing at least the tracks, by using so-called shielding techniques, by selecting specific shapes (square, round, etc.).

Moreover, the practical implementation of the present invention in the form of an integrated circuit is within the abilities of those skilled in the art based on the functional indications given hereabove and on the constraints imposed thereto by the used technology, and other practical implementations than those discussed hereabove as an example may be envisaged, provided to meet the described functionalities.

Besides, although the described embodiments more specifically apply to an integrated implementation, they may also be formed on a printed circuit.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A common-mode filter comprising:
in series between a first input terminal and a first output terminal, first and second positively coupled inductive elements;
in series between a second input terminal and a second output terminal, third and fourth positively coupled inductive elements;
in series between each midpoint of said series connections of inductive elements and the ground, a corresponding capacitive element and a fifth inductive element, wherein said capacitive elements are formed by diodes and wherein an additional diode is coupled in series with the fifth inductive element between the anodes of said diodes and ground; and wherein said anodes are common anodes.

2. A common-mode filter comprising:
in series between a first input terminal and a first output terminal, first and second positively coupled inductive elements;
in series between a second input terminal and a second output terminal, third and fourth positively coupled inductive elements; and
in series between each midpoint of said series connections of inductive elements and the ground, a corresponding capacitive element and a fifth inductive element, wherein an additional capacitive element is connected in parallel on the fifth inductive element.

3. The filter of claim 2, wherein the fifth inductive element is common to the two capacitive elements.

4. The filter of claim 2, wherein respective phase points of the first, second, third, and fourth inductive elements are all directed either towards the first and second input terminals, or towards the first and second output terminals.

5. The filter of claim 2, wherein said corresponding capacitive elements are formed by diodes.

6. The filter of claim 5, wherein said diodes have common anodes.

7. The filter of claim 5, wherein said capacitive elements formed by diodes further comprises two diodes connected in anti-series between each mid-point and said fifth inductive element.

8. The filter of claim 2, made in integrated form.

9. A common-mode filter comprising:
a first inductive element and a second inductive element connected in series between a first input terminal and a first output terminal, wherein the first and second inductive elements are positively coupled;
a third inductive element and a fourth inductive element connected in series between a second input terminal and a second output terminal, wherein the third and fourth inductive elements are positively coupled;
a first capacitive element connected between a midpoint of the series-connected first and second inductive elements and a common node;
a second capacitive element connected between a midpoint of the series-connected third and fourth inductive elements and the common node; and
a fifth inductive element connected between the common node and ground, wherein the common node is isolated from ground by the fifth inductive element.

10. A common-mode filter as defined in claim 9, further comprising a third capacitive element connected in parallel with the fifth inductive element.

11. A common-mode filter as defined in claim 9, wherein the first and second capacitive elements comprise diodes having anodes connected to the common node.

12. A common-mode filter as defined in claim 11, further comprising an additional diode connected in parallel with the fifth inductive element.

13. A common-mode filter as defined in claim 11, further comprising an additional diode connected in series with the fifth inductive element.

14. A common-mode filter as defined in claim 9, wherein the first and second capacitive elements each comprise back-to-back diodes.

15. A common-mode filter as defined in claim 9, wherein the first inductive element is formed in a first conductive level of a semiconductor device, the second inductive element is formed in a second conductive level of the semiconductor device, and the first inductive element is separated from the second inductive element by an insulating level, and wherein the first inductive element is formed over the second inductive element so that the first and second inductive elements are positively coupled.

16. A common-mode filter as defined in claim 9, wherein phase points of the first, second, third and fourth inductive elements are on a same side with respect to the first and second input terminals.

17. A common-mode filter as defined in claim 9, wherein the first, second, third and fourth inductive elements have equal values.

* * * * *